(12) United States Patent
Yasooka

(10) Patent No.: US 9,368,457 B2
(45) Date of Patent: Jun. 14, 2016

(54) HIGH-FREQUENCY PACKAGE

(71) Applicant: Kosuke Yasooka, Tokyo (JP)

(72) Inventor: Kosuke Yasooka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/378,485

(22) PCT Filed: Feb. 28, 2013

(86) PCT No.: PCT/JP2013/055410
§ 371 (c)(1),
(2) Date: Aug. 13, 2014

(87) PCT Pub. No.: WO2013/133122
PCT Pub. Date: Sep. 12, 2013

(65) Prior Publication Data
US 2015/0008565 A1 Jan. 8, 2015

(30) Foreign Application Priority Data

Mar. 7, 2012 (JP) .................................. 2012-050804

(51) Int. Cl.
*H01L 23/552* (2006.01)
*H01L 23/00* (2006.01)
(Continued)

(52) U.S. Cl.
CPC .............. *H01L 23/552* (2013.01); *H01L 24/16* (2013.01); *H01L 24/17* (2013.01); *H01L 23/66* (2013.01); *H01L 2224/16225* (2013.01); *H01L 2924/014* (2013.01); *H01L 2924/01079* (2013.01); *H01L 2924/1306* (2013.01); *H01L 2924/142* (2013.01);

(Continued)

(58) Field of Classification Search
None
See application file for complete search history.

(56) References Cited

U.S. PATENT DOCUMENTS

| 5,955,789 | A | * | 9/1999 | Vendramin | ....... H01L 23/49838 257/728 |
| 6,555,907 | B2 | * | 4/2003 | Katoh | ........................... 257/728 |
| 6,639,304 | B1 | * | 10/2003 | Oggioni | ............ H01L 23/49816 257/660 |

(Continued)

FOREIGN PATENT DOCUMENTS

| JP | 08-064983 | 3/1996 |
| JP | 09-252191 | 9/1997 |

(Continued)

OTHER PUBLICATIONS

International Search Report issued May 14, 2013, in PCT/JP13/055410, filed Feb. 28, 2013.

(Continued)

*Primary Examiner* — Erik Kielin
(74) *Attorney, Agent, or Firm* — Oblon, McClelland, Maier & Neustadt, L.L.P.

(57) ABSTRACT

A high-frequency package includes an MMIC including a signal source and a conductor pattern that is connected to the signal source, a substrate having a signal line and a GND formed thereon and the MMIC mounted thereon, a metal bump for signaling that is formed between the MMIC and the substrate, and connects the conductor pattern of the MMIC and the signal line of the substrate, and a plurality of metal bumps for shielding that are formed between the MMIC and the substrate so as to surround the signal source and the conductor pattern with the metal bump for signaling, where a space between a pair of adjacent metal bumps among the metal bump for signaling and the plurality of metal bumps for shielding is equal to or less than half of a wavelength of an electromagnetic wave generated from the signal source.

7 Claims, 1 Drawing Sheet

(51) Int. Cl.
*H01L 23/66* (2006.01)
*H05K 1/02* (2006.01)

(52) U.S. Cl.
CPC ....... *H01L 2924/1423* (2013.01); *H05K 1/0218* (2013.01); *H05K 2201/10734* (2013.01)

(56) References Cited

U.S. PATENT DOCUMENTS

| | | | |
|---|---|---|---|
| 7,268,067 B2* | 9/2007 | Hall et al. | 438/617 |
| 7,405,477 B1* | 7/2008 | Tao | H01L 23/49838 257/659 |
| 8,446,739 B2 | 5/2013 | Harikae | |
| 2002/0113309 A1* | 8/2002 | Fazelpour | 257/728 |
| 2005/0230828 A1* | 10/2005 | Wu | 257/738 |
| 2006/0226928 A1* | 10/2006 | Henning | H05K 1/0222 333/33 |
| 2010/0327452 A1 | 12/2010 | Kobayashi | |

FOREIGN PATENT DOCUMENTS

| | | | |
|---|---|---|---|
| JP | 10-012675 | | 1/1998 |
| JP | 3066855 | | 3/2000 |
| JP | 2000124259 A | * | 4/2000 |
| JP | 2001-257286 | | 9/2001 |
| JP | 2002-261455 | | 9/2002 |
| JP | 2006-203261 | | 8/2006 |
| JP | 2010-129559 | | 6/2010 |
| JP | 2010-153477 | | 7/2010 |
| JP | 2011-187812 | | 9/2011 |
| WO | 2009/110355 | | 9/2009 |

OTHER PUBLICATIONS

Japanese Office Action issued Feb. 18, 2015 in Japanese Patent Application No. 2014-503797 (w/ Partial English Translation (6 pages).

* cited by examiner

HIGH-FREQUENCY PACKAGE

FIELD

The present invention relates to a high-frequency package.

BACKGROUND

In recent years, there is used a configuration in which a semiconductor device such as an MMIC (Monolithic Microwave Integrated Circuit) and a high-frequency package substrate is flip-chip assembled on another substrate by a BGA (Ball Grid Array) that uses solder bumps. In this configuration, there are cases where gold bumps are used instead of solder bumps.

Conventionally, even if a semiconductor device is mounted on a substrate using an electrically-conductive adhesive or the like, when the semiconductor device is covered by a metal cover to airtightly seal the semiconductor device or when ventilation holes are small even though the metal cover is not a type that airtightly seals the semiconductor device, a high-frequency signal is not leaked from the semiconductor device to outside. Therefore, there has been no problem regarding EMI (ElectroMagnetic Interference) characteristics (see Patent Literature 1).

CITATION LIST

Patent Literature

Patent Literature 1: Japanese Patent Application Laid-open No. 2010-153477

SUMMARY

Technical Problem

However, if the semiconductor device is in a flip-chip assembly and is not electromagnetically shielded by a metal cover, a high-frequency signal is leaked from the semiconductor device to outside, and this leakage becomes a cause of degradation of EMI characteristics and increase of noise on a system.

The present invention has been achieved in view of the above problem, and an object of the present invention is to provide a high-frequency package in which leakage of a high-frequency signal to the outside is reduced even without covering a semiconductor device by a metal cover.

Solution to Problem

In order to solve above-mentioned problems and to achieve the object, a high-frequency package according to the present invention including: a semiconductor device including a signal source and a conductor pattern that is connected to the signal source; a substrate having a signal line and a ground formed thereon and the semiconductor device mounted thereon; a metal bump for signaling that is formed between the semiconductor device and the substrate, and connects the conductor pattern of the semiconductor device and the signal line of the substrate; first metal bumps for shielding that are formed between the semiconductor device and the substrate so as to be arranged to sandwich the metal bump for signaling, and are connected to the ground of the substrate; and second metal bumps for shielding that are formed in plural between the semiconductor device and the substrate so as to surround the signal source and the conductor pattern with the metal bump for signaling and the first metal bumps for shielding, and are connected to the ground of the substrate, where a space between each of the second metal bumps for shielding including a space thereof between first metal bumps for shielding is equal to or less than half of a wavelength of an electromagnetic wave generated from the signal source. The metal bump for signaling, the first metal bumps for shielding, and the second metal bumps for shielding are arranged in a substantially circular shape.

Advantageous Effects of Invention

According to the present invention, leakage of a high-frequency signal to the outside can be reduced even without covering a semiconductor device by a metal cover.

DESCRIPTION OF EMBODIMENTS

Exemplary embodiments of a high-frequency package according to the present invention will be explained below in detail with reference to the accompanying drawings. The present invention is not limited to the embodiments.

Embodiment

Figure 1:
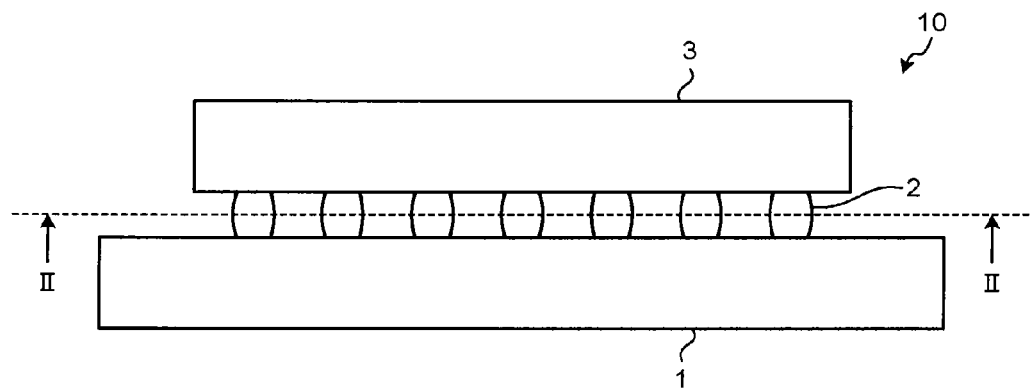
FIG. 1 is a side view of a configuration of a high-frequency package according to an embodiment of the present invention.

FIG. 1 is a side view of a configuration of a high-frequency package according to an embodiment of the present invention. A high-frequency package 10 according to the present embodiment has a configuration in which an MMIC 3 is mounted on a substrate 1, which has a signal line and a GND (ground) formed thereon, via metal bumps 2. Solder or gold can be applied as the material of the metal bumps 2.

Figure 2:
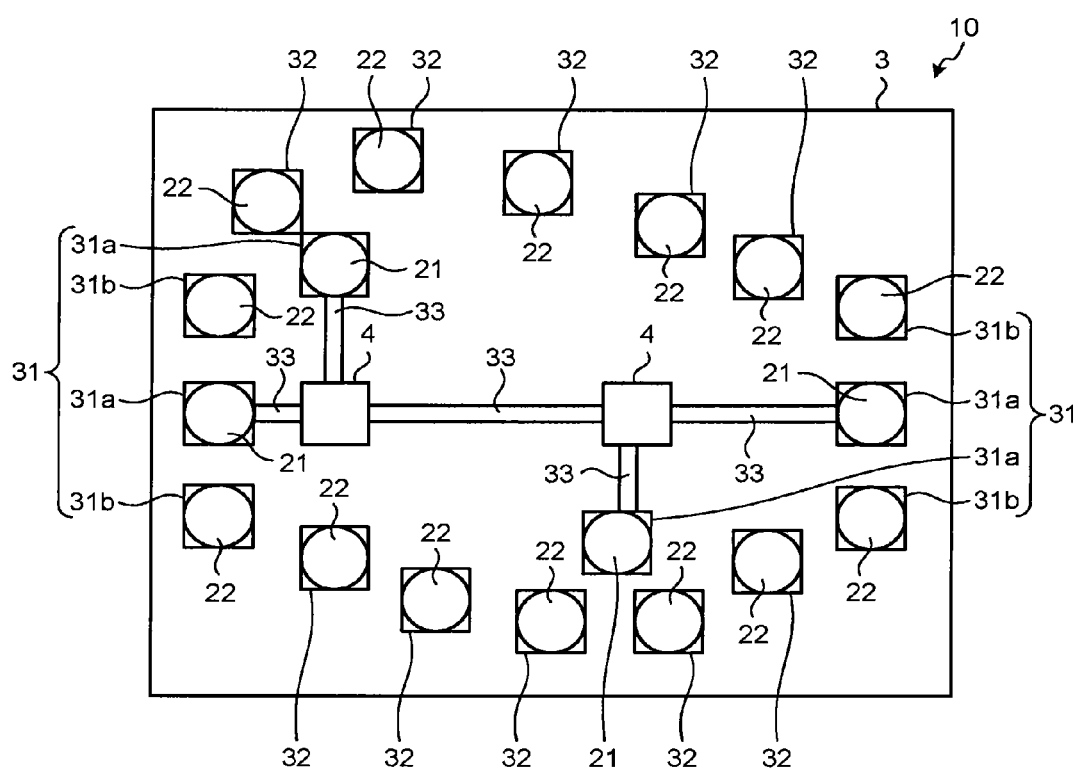
FIG. 2 is a cross-sectional view of the high-frequency package according to the embodiment.

FIG. 2 is a cross-sectional view of the high-frequency package 10 according to the present embodiment, and depicts a cross section along the line II-II in FIG. 1. Terminals 31 for wiring and terminals 32 for shielding are arranged on the bottom face of the MMIC 3. In FIG. 2, the metal bumps 2 are shown separately as metal bumps 21 for signaling and metal bumps 22 for shielding. The metal bumps 21 for signaling are bumps that connect a conductor pattern 33 to the signal line formed on the substrate 1. The metal bumps 22 for shielding are bumps that shield an electromagnetic wave leaked from a signal source 4 or the conductor pattern 33.

The terminal 31 for wiring includes terminals 31a for signaling and terminals 31b for grounding. The terminals 31a for signaling are connected to the signal source 4 (such as a FET (Field Effect Transistor)) via the conductor pattern 33, and are connected to the signal line of the substrate 1. The ground terminal 31b are connected to the GND of the substrate 1, and are arranged so as to sandwich the terminal 31a for signaling that is arranged on a peripheral part of the MMIC 3. With this configuration, the peripheral part of the MMIC 3 is in a state where so-called "GSG connection" is formed, and thus an electromagnetic wave hardly leaks from the MMIC 3.

Furthermore, the terminals 32 for shielding are connected to the GND of the substrate 1.

The wiring terminal 31 and the terminal 32 for shielding are arranged such that the space between these terminals is less than half of a wavelength of an electromagnetic wave generated from the signal source 4 and that these terminals surround the periphery of the conductor pattern 33.

The metal bump 21 for signaling is arranged in the signal terminal 31a, and the terminal 31a for signaling is connected to a signal line on the side of the substrate 1 via the metal bump 21 for signaling. Furthermore, the metal bump 22 for shielding is arranged in the ground terminal 31b, and the ground terminal 31b is connected to a GND on the side of the substrate 1 via the metal bump 22 for shielding. Further, the metal bump 22 for shielding is arranged in the terminal 32 for shielding, and the terminal 32 for shielding is connected to the GND on the side of the substrate 1 via the metal bump 22 for shielding.

In the above configuration, the metal bump 2 surrounds the conductor pattern 33 with a space that is equal to or less than half of a wavelength of an electromagnetic wave generated from the signal source 4, and thus the metal bump 2 functions as an electromagnetic shield. Accordingly, the electromagnetic wave generated from the signal source 4 is prevented from leaking to outside of an area surrounded by the metal bump 2. With this configuration, degradation of EMI characteristics and increase of noise can be suppressed. In addition, when respective spaces between the terminals 31 for wiring and the terminals 32 for shielding are narrowed, shielding characteristics of the high-frequency package can be improved.

In the present embodiment, because coupling of the MMIC 3 to adjacent MMICs can be suppressed, it is possible to prevent oscillations due to looping of their noises. For example, when another MMIC is connected in series with the front stage of the MMIC 3, if an output from the MMIC 3 superimposes on an input from another MMIC, the looping of their noises occurs. However, in the present embodiment, because leakage of an electromagnetic wave from the MMIC 3 is prevented, such troubles can be suppressed. Therefore, the yield at the time of manufacturing the high-frequency package 10 can be improved.

In the above embodiment, there has been explained a configuration example in which the terminals 31b for grounding are arranged in the terminal 31 for wiring so as to sandwich the terminal 31a for signaling; however, the above embodiment is not necessarily limited to this configuration. Furthermore, in the above embodiment, while there has been explained a configuration example in which the terminals 32 for shielding are connected to the GND of the substrate 1, it is also possible to employ a configuration in which the terminals 32 for shielding are connected to the signal line of the substrate 1. Further, it is also possible to employ a configuration in which a part of the terminals 32 for shielding is connected to the GND of the substrate 1 and the rest of the terminals 32 for shielding is connected to the signal line of the substrate 1. Electromagnetic shielding characteristics can be improved when the terminals 32 for shielding are connected to the GND of the substrate 1.

INDUSTRIAL APPLICABILITY

As described above, the high-frequency package according to the present invention is useful in a feature that leakage of an electromagnetic wave can be suppressed even in a state where the high-frequency package is not airtightly sealed, and is particularly suitable in a case where a signal is processed as the high-frequency package is connected in series with adjacently located other high-frequency packages.

REFERENCE SIGNS LIST 1 substrate, 2 metal bump, 3 MMIC, 4 signal source, 10 high-frequency package, 21 metal bump for signaling, 22 metal bump for shielding, 31 terminal for wiring, 31a terminal for signaling, 31b terminal for grounding, 32 terminal for shielding, 33 conductor pattern.

The invention claimed is:

1. A high-frequency package comprising:
a semiconductor device including a signal source and a conductor pattern that is connected to the signal source;
a substrate having a signal line and a ground formed thereon and the semiconductor device mounted thereon;
a metal bump for signaling that is formed between the semiconductor device and the substrate, and connects the conductor pattern of the semiconductor device and the signal line of the substrate;
first metal bumps for shielding that are formed between the semiconductor device and the substrate so as to be arranged to sandwich the metal bump for signaling, and are connected to the ground of the substrate; and
second metal bumps for shielding that are formed in plural between the semiconductor device and the substrate so as to surround the signal source and the conductor pattern with the metal bump for signaling and the first metal bumps for shielding, and are connected to the ground of the substrate, wherein
the first metal bumps for shielding and the second metal bumps for shielding are arranged along a circumference of a substantially circular shape that reduces leakage of a high-frequency signal, and the metal bump for signaling is arranged along the circumference of the substantially circular shape,
the signal source and the conductor pattern are arranged within the substantially circular shape and not connected to the outside of the circumference through a space between each of the metal bump for signaling, the first metal bumps for shielding and the second metal bumps for shielding, and
the space between each of the metal bump for signaling, the first metal bumps for shielding and the second metal bumps for shielding, is equal to or less than half of a wavelength of an electromagnetic wave generated from the signal source.

2. The high-frequency package according to claim 1, wherein the metal bump for signaling is connected to the signal line of the substrate so that the first metal bumps for shielding sandwich the metal bump for signaling to form a ground-signal-ground (GSG) connection on a peripheral part of the semiconductor device.

3. The high-frequency package according to claim 1, further comprising:
a first terminal for signaling, wherein
the metal bump for signaling is formed in the first terminal for signaling.

4. The high-frequency package according to claim 3, further comprising:
a second terminal for shielding, wherein
one of the second metal bumps for shielding is found in the second terminal for shielding.

5. The high-frequency package according to claim 4, wherein the second terminal for shielding is connected to the ground.

6. The high-frequency package according to claim 5, wherein the first terminal for signaling is connected to the signal line.

7. The high-frequency package according to claim 1, wherein the semiconductor device is not covered by a metal cover.

* * * * *